United States Patent
Xia et al.

(10) Patent No.: US 6,573,735 B2
(45) Date of Patent: Jun. 3, 2003

(54) RELIABILITY OF VIAS AND DIAGNOSIS BY E-BEAM PROBING

(75) Inventors: William Xia, San Diego, CA (US); Martin Villafana, San Diego, CA (US); Jonathan Tappan, San Diego, CA (US); Tim Watson, San Diego, CA (US); Michael Campbell, Encinitas, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/877,885

(22) Filed: Jun. 8, 2001

(65) Prior Publication Data

US 2002/0186028 A1 Dec. 12, 2002

Related U.S. Application Data

(60) Provisional application No. 60/213,570, filed on Jun. 22, 2000, and provisional application No. 60/273,682, filed on Mar. 6, 2001.

(51) Int. Cl.[7] .......................................... G01R 31/305
(52) U.S. Cl. ..................... 324/751; 324/158.1
(58) Field of Search ................. 324/751, 501, 324/158.1; 250/310, 311; 714/25, 736, 726

(56) References Cited

U.S. PATENT DOCUMENTS

| | | | | |
|---|---|---|---|---|
| 4,829,243 A | * | 5/1989 | Woodward et al. | 250/310 |
| 5,122,753 A | | 6/1992 | Myers et al. | 324/537 |
| 5,192,913 A | | 3/1993 | Goruganthu et al. | 324/537 |
| 5,231,135 A | | 7/1993 | Frosien et al. | 324/158 |
| 5,552,716 A | * | 9/1996 | Takahashi et al. | 324/751 |
| 5,804,980 A | * | 9/1998 | Nikawa | 324/538 |
| 5,943,346 A | | 8/1999 | Sanada | 371/27.1 |

* cited by examiner

*Primary Examiner*—Kamand Cuneo
*Assistant Examiner*—Tung X. Nguyen
(74) *Attorney, Agent, or Firm*—Philip Wadsworth; Charles D. Brown; Bruce W. Greenhaus

(57) ABSTRACT

Electronic devices, such as IC devices, are tested by determining a failure net within the electronic device that is causing a device failure. After identifying the failure net, the failure net is locally stressed. The stress is applied so that only the net being tested is subjected to the stress, and the remaining nets and components of the device are not stressed. A change in a signal produced by the failure net is observed while the failure net is being subjected to the stress. Testing in this manner assists in identifying the failure net as a failure source of the device.

15 Claims, 8 Drawing Sheets

PRIMARY FEATURES OF AN IDS ELECTRON OPTICAL COLUMN

IDS 10000 FRONT VIEW

FIG. 4: PRIMARY FEATURES OF AN IDS ELECTRON OPTICAL COLUMN

RELIABILITY OF VIAS AND DIAGNOSIS BY E-BEAM PROBING

The present application claims priority to U.S. Provisional Application No. 60/213,570, filed Jun. 22, 2000, and U.S. Provisional Application No. 60/273,682, filed Mar. 6, 2001.

BACKGROUND OF THE INVENTION

1. Field of the Invention

The invention relates to testing of electronic devices. In particular, the invention relates to monitoring a net in a device to determine if the net is the source of a failure.

2. Description of the Related Art

Chip complexity and increased packaging used in electronic devices are decreasing device geometries at a rapid pace. Currently, geometries in electronic devices have migrated from 0.18 μm down to 0.13 μm. The trend to smaller device geometries is expected to continue in the future. As device geometries decrease, problems associated with testing and debugging devices continue to become more difficult.

To help obviate some of the difficulties of testing these small geometries, designers are making extensive use of simulation and design verification software to eliminate design problems before a device is fabricated. While simulation and verification software do identify some design problems before fabrication, many designs do not yield fully operational, full specification, parts without first undergoing lengthy, and expensive, debug phases. In addition, even if all the design problems are identified and corrected prior to fabrication, defects may be introduced into the device during the manufacturing process.

During the test and debug process, probing of internal nets of a device is becoming an increasingly valuable tool. Probing internal nets of a device assists in identifying and isolating portions internal to a device that are not performing properly. One technique used to provide access to internal nets is to include pads on some "critical" internal nets during the design of a device, and thereby allow access to these nets during test and debug. However, the vast majority of internal nets will not have pads, and therefore no direct access to these nets is possible.

Packaging density and chip complexity restrict a device designer in placement of pads on internal nets due to space limitations within the device. This is particularly true in very large scale integrated circuits (VLSI) such as gate arrays, field programmable gate arrays (FPGA), and application specific integrated circuits (ASIC) such as mixed signal integrated circuits. The lack of direct access to all of the internal nets of a device complicates the test and debug process.

Certain aspects of device layout further increases the complexity of testing and debugging. For example, it is very difficult to detect a defect, such as a manufacturing defect, at the bottom of a trench or a via. Typically, detection of a defect at the bottom of a trench or via requires a failure analysis of the device using instrumentation such as electron microscopes. In addition, intermittent failures, such as stress related intermittent failures, are especially difficult to locate due to their nonrepetitive nature.

Several techniques have evolved in testing and debugging electronic devices. Some of these techniques include functional testing, burn-in testing, and defect detection.

Functional testing is typically used to verify proper operation of an electronic device. For example, an IC may undergo functional testing following the completion of the IC fabrication process. Test leads, or probes, are connected to the Input and Output (I/O) pins of the IC. Test stimuli are applied to input pins of the IC and the output pins of the IC are monitored to determine if expected signals are produced. Functional testing is typically performed under normal ambient conditions, so that the device under test is not being exposed to any type of external stress, for example, environmental stress such as elevated temperature.

Another technique used in testing and debugging electronic devices is burn-in testing. Typically, a burn-in test of a device involves elevating the ambient temperature of a device that has power applied. A burn-in test will stress the entire device, including all nets within the device. Due to the environment that the device is being tested in, it may not be practical to decapsulate a device to expose the internal nets of the device due to environmental concerns, such as, condensation in the device. Furthermore, even if the device could be decapsulated, making the internal nets of the device accessible, failure of an individual net may be difficult to identify through burn-in testing because the entire device and all nets are stressed equally.

A third technique, defect detection, monitors the device I/O pins as well as probes internal nets of the device. Typically, probing internal nets of a device requires that the device be decapsulated, thereby providing access to the internal nets. Because the device is decapsulated, environmental stressing of the decapsulated device may be impractical.

One technique used to probe internal nets uses mechanical probes. Mechanical probes may be aligned, and physically contact an internal net of the device. One drawback to using mechanical probes is that they may load the electrical circuit of a net being tested. For example, the mechanical probes may increase circuit capacitance and therefore distort the measured performance of the circuit from how the circuit would perform without the added loading of the mechanical probes.

A technique that has been developed to eliminate loading of a circuit of a device under test is an electronic-beam (e-beam) probe. Recent development of e-beam probe tools and techniques have greatly assisted in overcoming some of the problems involved in probing internal nodes of electronic devices for debug and other purposes.

E-beam probing uses the principle of voltage contrast in a scanning electron microscope (SEM). A conventional SEM image is produced by raster-scanning a finely-focused beam of primary electrons over a device under test as signals are applied to the device. Secondary electrons are produced as the primary beam is reflected from the device under test. The secondary electrons reflected from the device are measured and, using a scintillator, photo-multiplier tube (PMT) and associated electronics, an image of the nets of the device under test is produced. The energy of the secondary electrons produced by the device under test results from variations in the electrical potential on the surface of conductors, or nets, within the device. Secondary electrons that strike the face of the scintillator produce a number of photons proportional to the energy of the secondary electrons, which are emitted from the scintillator and strike the face of the PMT. The PMT outputs a voltage proportional to the number of photons that strike its face. The voltage out of the PMT is amplified by associated electronics and used to produce an image that corresponds to the electrical potential on the surface of the conductors and nets within the device. In this way, the e-beam technique provides an indication of node voltages.

For example, positive voltages may appear as dark areas in the image, corresponding to a low secondary electron count. Zero, or negative, voltages may appear as light areas in the image, corresponding to a higher secondary electron count.

E-beam probing offers several advantages over other probing techniques, such as mechanical probing. An e-beam probe is typically passive, meaning that it does not interact or load the electrical circuit that is being monitored. In contrast, as mentioned above, mechanical probes may load the circuit being tested, making measurements inaccurate.

Therefore, there is a need for an effective way to monitor the operation of internal nets of an electronic device, without affecting the operation of the device, identifying particular nets that may be the source of failure.

SUMMARY OF THE INVENTION

Identifying a failure net in an integrated circuit (IC) whose output indicates an IC failure includes determining a potential failure net by observing a signal produced by the net that indicates failure, stressing the potential failure net while leaving other IC nets unaffected, and observing a change in the signal produced by the potential failure net in response to the stress, thereby identifying the potential failure net as a failure net of the IC.

Stressing a net in a device, or IC, may include aligning an external source of stress to the net, applying stress to the net while leaving other device nets unaffected, and monitoring the net, while the stress is being applied, to determine if the net fails while it is being stressed.

Locally stressing a net in a device, or IC, may include aligning an e-beam probe onto a suspect net within the device. Once the e-beam probe is aligned with the suspect net, the current in the e-beam is increased, thereby locally applying stress the device near the suspect net.

Other features and advantages of the present invention should be apparent from the following description of the preferred embodiment, which illustrates, by way of example, principles of the invention.

DETAILED DESCRIPTION

In a typical integrated circuit (IC) electronic device, such as a very large scale integration (VLSI) chip, there are many interconnections and vias internal to the device. Most of the internal connections and vias of the IC are not directly accessible by a mechanical probe. It may not be practical to identify a particular net for failure without monitoring the nets of an IC while the device is being exercised by a test signal. An initial step in a failure analysis of a device is to determine the location of the failure. As discussed above, probing internal nets is challenging. Mechanical probes tend to load the electrical circuit being monitored, and thus may provide inaccurate, and nonrepeatable, measurements. Therefore, a non-contact, repeatable measurement technique for monitoring internal nets of a device is desirable.

One type of non-contact, repeatable, measurement unit for monitoring internal nets of a device is an electronic-beam (e-beam) probe. Typically, an e-beam probe will be mounted on a positioning device to provide coarse alignment of the e-beam with a desired net within the device. If the positioning device controller has access to the device layout database the positioning device will be able to automatically locate pre-identified nets within the device. Fine alignment of the e-beam is typically accomplished with focusing coils, or an objective lens, as discussed below.

In addition to monitoring an internal net, it may also be desirable to apply stress locally to the device, for example to stress only one net of the device under test. By stressing only a desired net, and not affecting other nets, a failure mode of a device may be isolated and identified. For example, if an individual net has a failure that is temperature dependent, then by being able to stress the individual net it may be possible to reliably determine if the stressed net is the source of the failure.

Figure 1:
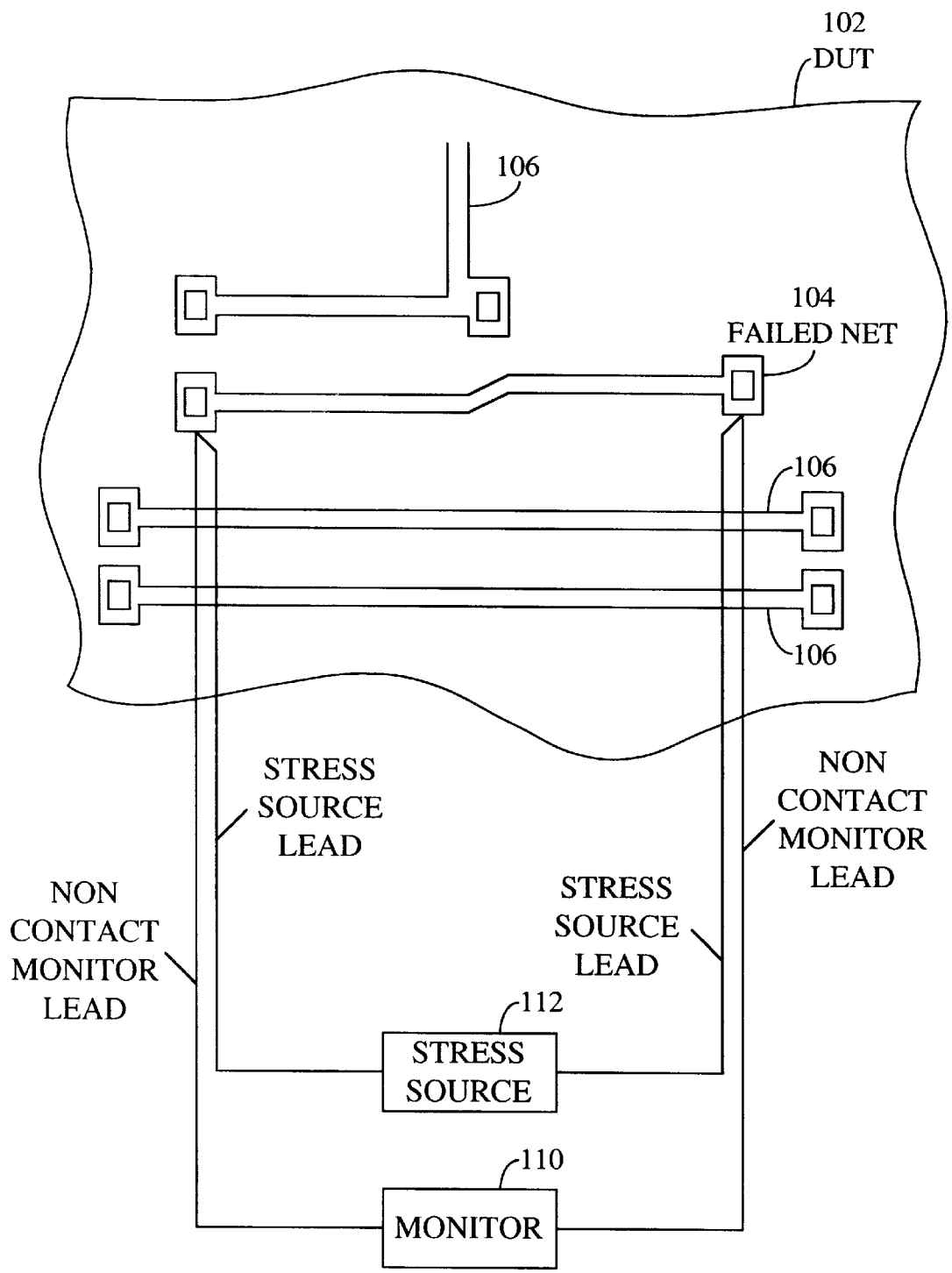
FIG. 1 is a diagram of a portion of a device under test, and test equipment, illustrating aspects of a system constructed in accordance with the invention.

FIG. 1 is a diagram of a portion of a device under test 102, and test equipment, illustrating aspects in accordance with the invention. A portion of the device under test 102 is illustrated showing a plurality of internal nets and vias. As described below, one of the nets has been identified as a potential failure net 104, and the other, remaining, nets 106 are believed to be operating satisfactorily. Test stimuli are applied to the I/O pins of the device under test 102 and signals on the nets 104 and 106 vary accordingly.

In one embodiment, the signals on the potential failure net 104 are monitored using a non-contact measurement device 110, for example, an e-beam probe. In addition, a stress source 112 is aligned with the failure net 104. The stress source is configured to apply a source of stress, for example, temperature, current, or voltage.

In another embodiment, the stress source uses mechanical probes, configured to minimize any loading of the electrical circuit, to apply the stress. In another embodiment, the stress source uses non-contact probes, such as e-beam or laser light, to apply the stress.

In yet another embodiment, the stress source 112 and the non-contact measurement device 110 are the same unit, for example, a single e-beam probe configured to monitor potential failure nets as well as to apply stress. For example, the current density of the primary beam from the e-beam probe may be increased from a nominal value of about 1 nAmp used to monitor the net to a value of about 50 nAmps used to apply stress. In contrast with conventional use of an e-beam probe, by increasing the current density in the e-beam probe, the probe is no longer just a passive monitoring device. Instead, the e-beam probe is actively interacting with the net by applying a localized stress to the net, while at the same time monitoring the reflected secondary signal from the net. In all these embodiments, the stress is applied to a single potential failure net while the net is being exercised by a test input and monitored.

In accordance with the invention, a variety of trace-back techniques may be used to identify a potential failure net. Trace-back is a systematic testing of nets beginning at a location in the device that has an identified failure, for example a failure at an output of a device found during functional testing. For example, if a failure is detected at an output node of a portion of an electrical circuit, then the input nets to that portion of the electrical circuit are tested. If all the input nets to the portion of the electrical circuit test "good" then the failure is isolated to that portion of the electrical circuit identified. If one, or more, of the input nets to the portion of the electrical circuit are identified as failing, then testing proceeds back to the electrical circuitry that is the source of the failing input net. Testing continues until the failing portion of the electrical circuitry is isolated.

Figure 2:
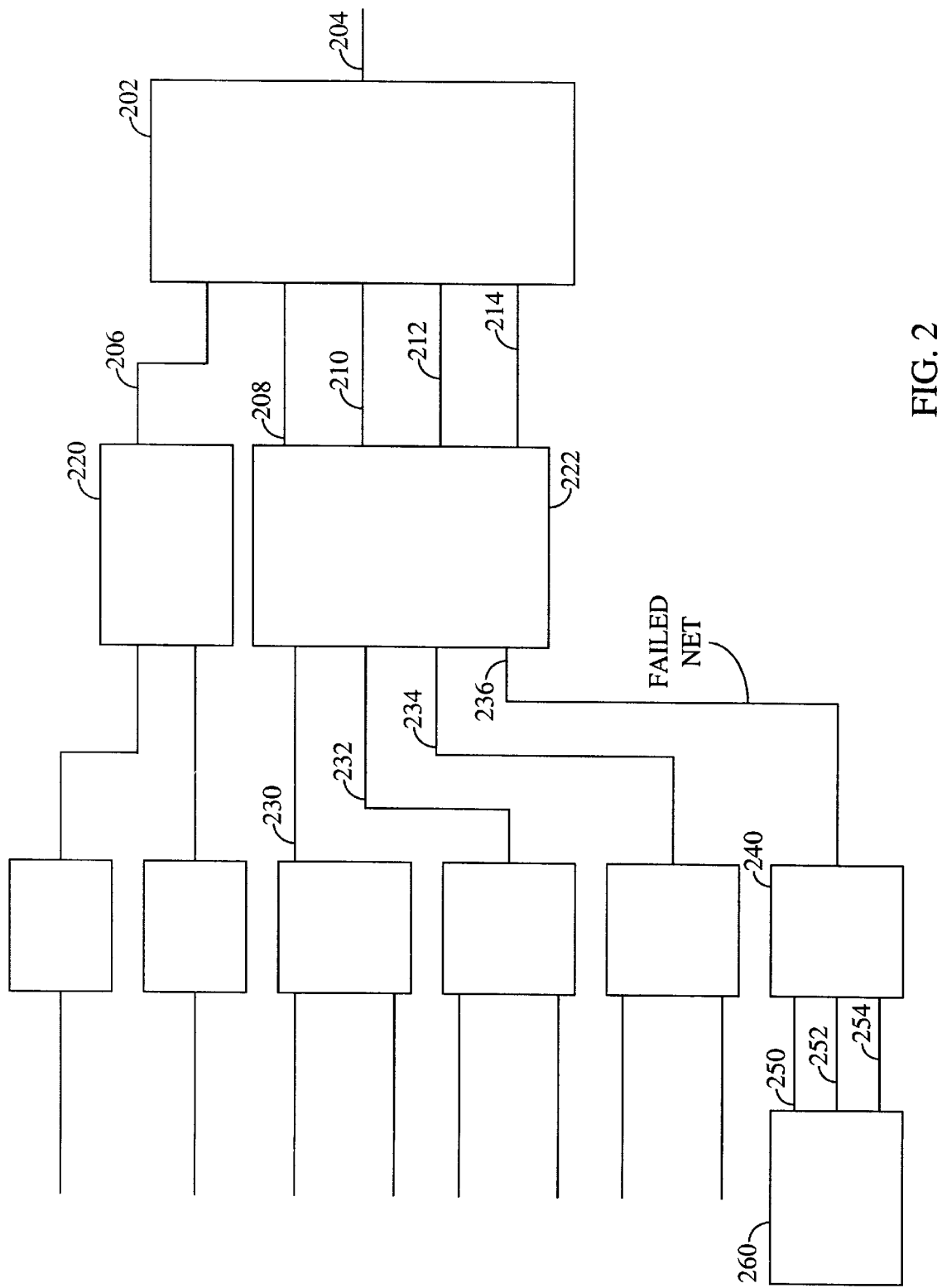
FIG. 2 is a schematic of an exemplar circuit illustrating trace-back.

FIG. 2 is a schematic diagram of an exemplary circuit, of an IC device 200, illustrating a trace-back technique that was applied to identify a net. For this illustration an unstable digital circuit in an IC, for example a mixed signal VLSI device, is described. In FIG. 2 the digital value output by a register 202, as measured on the net 204, is indicating a circuit failure. To determine if the failure is in the register 202 or the net 204, the input signals to the register 202, and the nets 206, 208, 210, 212 and 214, are monitored. In this example, nets 206, 208, 210 and 212 tested satisfactorily, while net 214 had a failure. Because the net 206 tested satisfactorily, the circuit device 220 feeding the net 206, and the nets feeding the circuit device 220, are not tested further. The nets feeding the circuit device 222 are tested to determine if there is a failure on a net feeding the circuit device 222 or if the circuit device 222 is causing the failure.

The inputs to the circuit device 222 are nets 230, 232, 234 and 236. In this example nets 230, 232 and 234 tested successfully and net 236 failed. Because nets 230, 232 and 234 tested successfully, additional testing of the circuitry feeding these nets is not performed. Because net 236 failed, the nets feeding the circuit device 240 are tested to determine if there is a failure on the nets feeding the circuit device 240 or if the circuit device 240 is causing the failure.

The inputs to the circuit device 240 include nets 250, 252, and 254. In this example nets 250, 252, and 254 tested successfully. Thus, the trace-back testing has isolated the failure to either the circuit device 240 or net 236. To determine if the circuit device 240 is failing or if net 236 is failing additional testing is performed where net 236 is locally stressed, without stressing the circuit device 240 or any other circuit devices, or nets, in the IC device 200. By stressing the net 236 it may be possible to isolate the failure to the individual net 236.

As discussed above, reliability of via structures in VLSI devices is a major concern in the fabrication of semiconductor devices. In particular, tungsten via structures in aluminum alloy interconnect systems have been susceptible to a high level of failure. As discussed above, failure analysis of via defects is an ever increasing challenge. Aspects of the invention are discussed next in relation to a failure analysis performed on an unstable digital circuit that caused intermittent failures in a mixed signal VLSI device. The failure analysis on this device revealed a via structure containing voids and an anomalous thin layer under the Ti/TiN adhesion layer at the interface of a tungsten plug and the underlying AlCu alloy.

The unstable digital circuit was part of a mixed signal device that included both digital and analog circuitry. The device had passed wafer probing and final testing, and thereafter was shipped to the field. In the field the device exhibited intermittent failures. The device was returned from the field and a conventional failure analysis was performed. Multiple manual probing techniques were attempted without success to analysis the failure mode. A problem with the mechanical probing, as discussed above, was that the mechanical probe loaded the electrical in the device that was being tested. Loading of the circuit being tested produced inadequate, unreliable, test results. To eliminate the loading produced by the mechanical probes, a non-contact technique, using an e-beam probe in accordance with the invention, was implemented to perform the failure analysis of the device.

Figure 3:
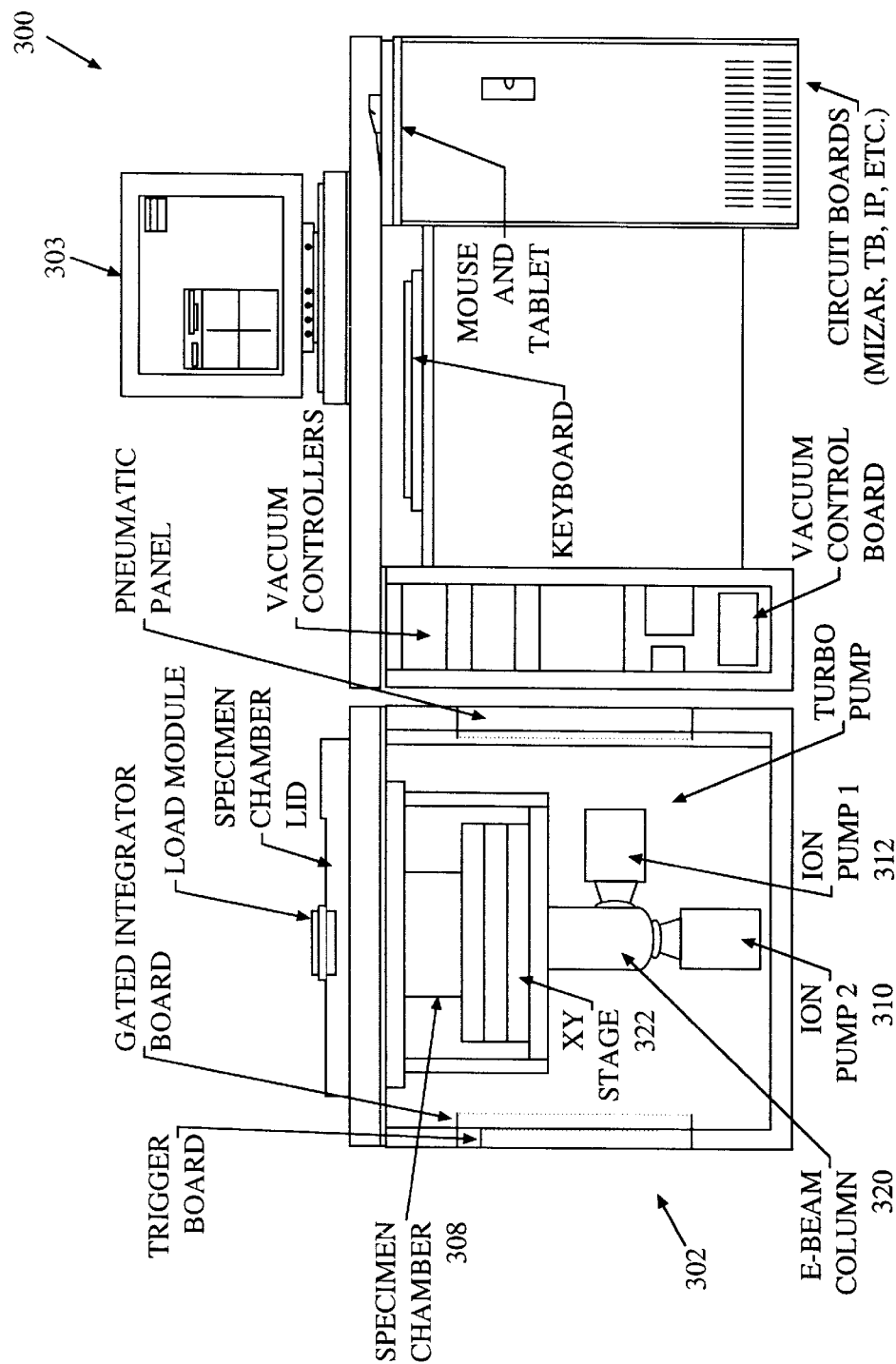
FIG. 3 is a block diagram of a test station used in accordance with the invention.

FIG. 3 is a block diagram of a test station 300 used in accordance with the invention. The test station includes an e-beam probe unit 302, such as the Schlumberger IDS 10000plus. The test station includes a workstation 303 used by the test operator to control the test equipment, as well as to provide a visual display of the test results to the operator.

The e-beam probe unit 302 includes a load module 304 that holds the device under test and provides electrical connection to the I/O pins on the device. The load module 304, after the device under test has been mounted to it, is secured to the specimen chamber lid 306. Prior to mounting the device under test to the load module 304, the device has the top portion of its encapsulation removed. This exposes the internal structure of the device, including the internal nets. When the load module 304 is secured to the specimen chamber 306, the device under test is positioned facing downward, with the exposed internal structure facing into the specimen chamber 308.

At the bottom of the specimen chamber 308 there are two ion pumps 310 and 312. The ion pumps 310 and 312 are used to produce a vacuum within the specimen chamber. At the end of the specimen chamber 308 opposite the device under test is an e-beam column 320. As discussed below, the e-beam column generates an electron beam that is focused onto the device under test for monitoring voltages on internal nets of the device. The e-beam column 320 and ion pumps 310 and 312 are mounted to an XY stage 322. XY stage 322 allows for coarse alignment of the electron beam generated by the e-beam column with the internal nets of the device under test.

Figure 4:
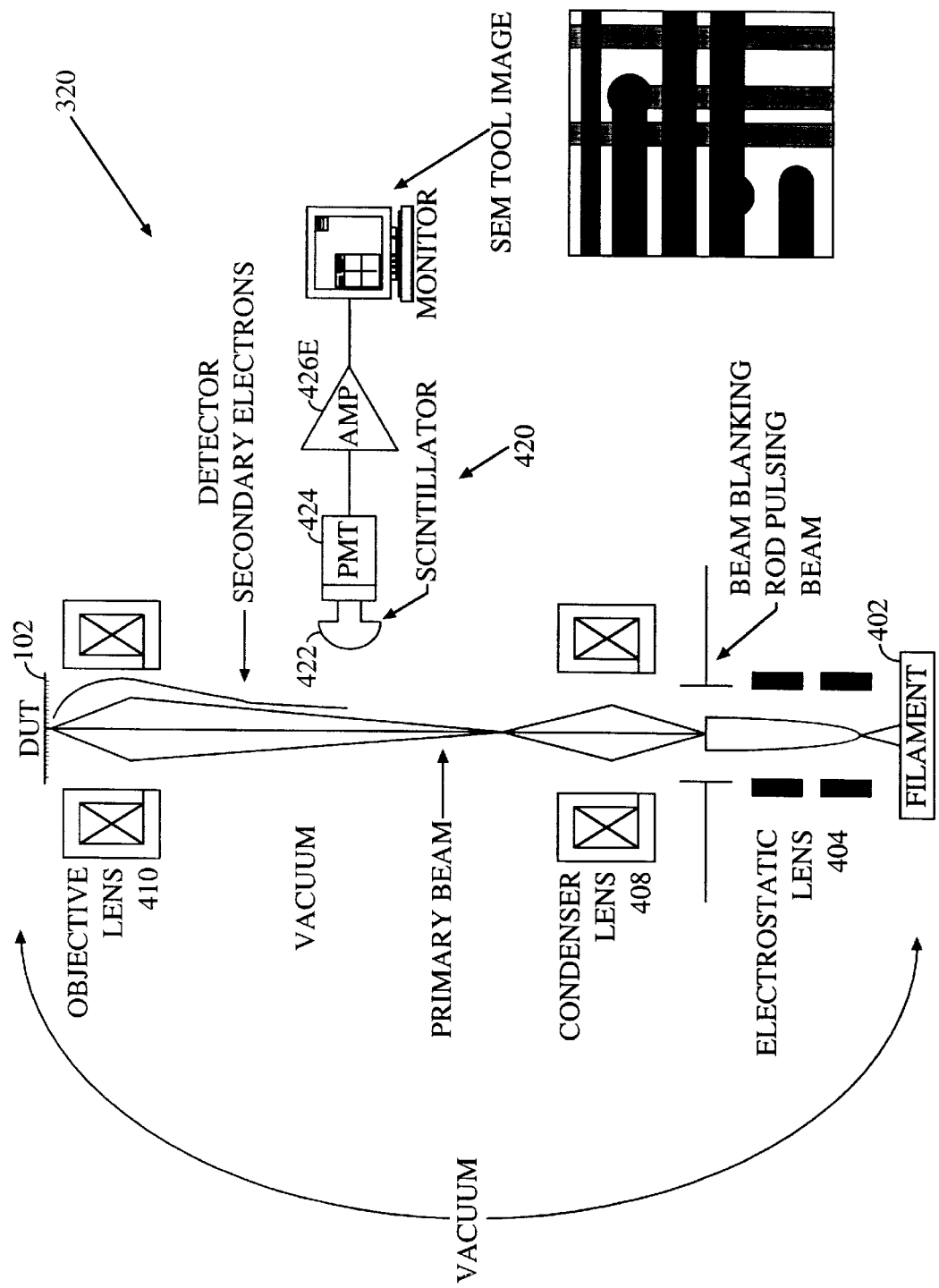
FIG. 4 is a block diagram showing additional detail of the e-beam column.

FIG. 4 is a block diagram showing additional detail of the e-beam column 320. The e-beam column 320 includes a filament 402. The filament 402 generates electrons used to produce the e-beam. The electrons emitted by the filament 402 are accelerated by an electrostatic lens 404 toward the device under test 102. After the electrons pass through the electrostatic lens 404, the electrons are focused into a beam by a condenser lens 408. The electron beam passing through the condenser lens 408 travels through the vacuum in the specimen chamber towards the device under test 102.

As the electron beam nears the device under test 102 it passes through an objective lens 410. The objective lens 410 focuses the electron beam into a primary electron beam that is directed onto the desired internal net of the device under test 102. The primary electron beam interacts with the internal net of the device under test 102, and secondary electrons are emitted back into the specimen chamber.

Located between the condenser lens 408 and the objective lens 410 is a detector 420. The detector 420 includes a scintillator 422. The scintillator 422 emits photons, in proportion to the energy of the secondary electrons, when the secondary electrons strike its face. The photons emitted by the scintillator 422 are directed to a photomultiplier tube (PMT) 424. The PMT 424 is configured to generate a voltage proportional to the number of photons that strike its face. Thus, the PMT 424 output voltage is proportional to the energy of secondary electrons emitted by the internal net in the device under test. The PMT 424 output voltage is sent to an amplifier 426 where the signal is amplified and conditioned. The amplifier 426 signal output is routed to the workstation 300 where it is processed and a display is generated for the operator.

As discussed above, the display is an image that represents the intensity variations of the secondary beam due to the electrical potential on the surface of conductors, or nets, within the device. For example, positive voltages may appear as dark areas in the image, corresponding to a low secondary electron count. Zero, or negative, voltages may appear as light areas in the image, corresponding to a higher secondary electron count.

The test setup described above was used to test the failed mixed signal device. Using trace-back techniques with an e-beam probe, the device failure was narrowed down to an individual 8-bit right-shift register used for digital data input. Additional testing revealed that data signals from the 8-bit register failed to match pre-assigned ID codes. The failure of the signals out of the 8-bit register were believed to be a cause of the functional failure of the device.

Figure 5:
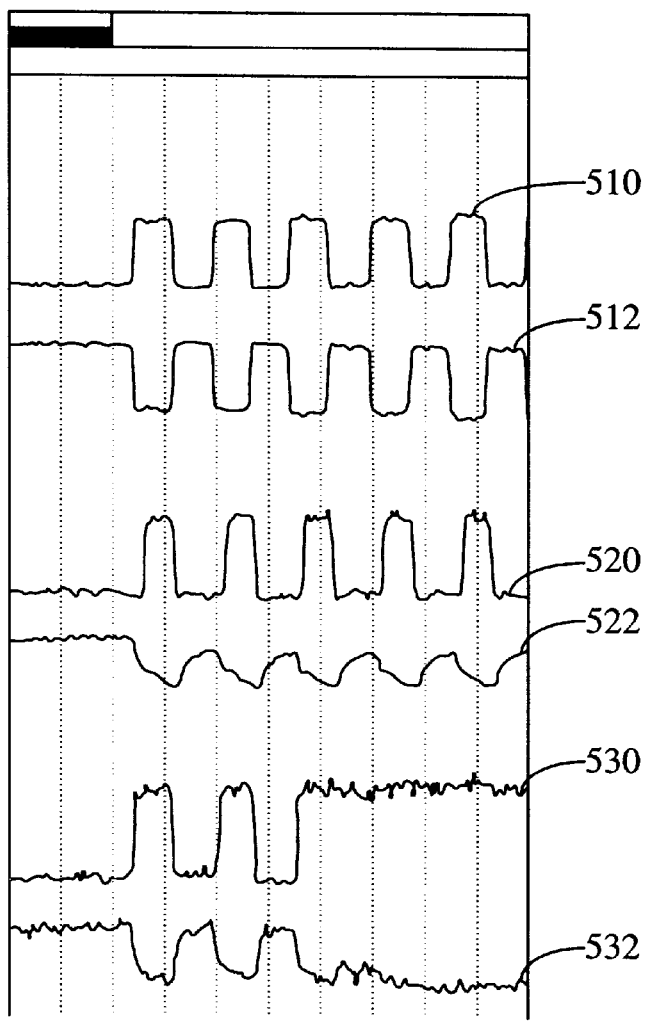
FIG. 5 is a graph illustrating the output waveforms of a typical two phase clock generator and the clock generator under test.

To assist in identifying the failure mechanism of the device, all the register related nets were measured using the e-beam probe. The e-beam probe testing revealed that a two phase clock generator in the digital circuitry produced irregular waveforms. FIG. 5 is a graph illustrating the output waveforms of a typical two phase clock generator and the clock generator under test. Traces 510 and 512 illustrate satisfactory clock generator output signals from a known good device. Traces 520 and 522 illustrate the output signals of the clock generator under test. Trace 522 is irregular, being nearly triangular rather than the expected squarewave shape.

Additional e-beam probing of all the internal nets of the clock generator localized the failure to an output inverter (buffer) of the failed clock generator.

After identifying the failed output inverter as a possible failure, the nets of the output inverter were locally stressed. The techniques used to locally stress the nets used in this example included increasing the current in the e-beam, and increasing the electron flux of the e-beam. During the testing of the mixed signal device, the test station 300 was operated to increase the current in the e-beam from about 1 nAmp to monitor the net, to about 50 nAmps to stress the net. In addition, a higher magnification of the e-beam through the objective lens 410 of the e-beam column 320 was used to concentrate the e-beam onto a smaller area of the net, thereby increasing the electron flux.

Traces 530 and 532 illustrate the clock generator output signals while undergoing localized thermal stress. As traces 530 and 532 illustrate, it was discovered that the clock generator output suffers severe distortion, no longer oscillating, when thermally stressed.

Simulations were performed using high via resistance on the output net of the failing inverter. The simulation produced a signal similar to the triangular trace 522 measured with the e-beam probe. Further simulation increased the via resistance to a very high value, and the inverter output stopped switching, similar to traces 530 and 532. Because traces 530 and 532 were made when the net was being subjected to thermal stress, it was believed that the thermal stress may have caused the net resistance to increase to a very high value.

Figure 6:
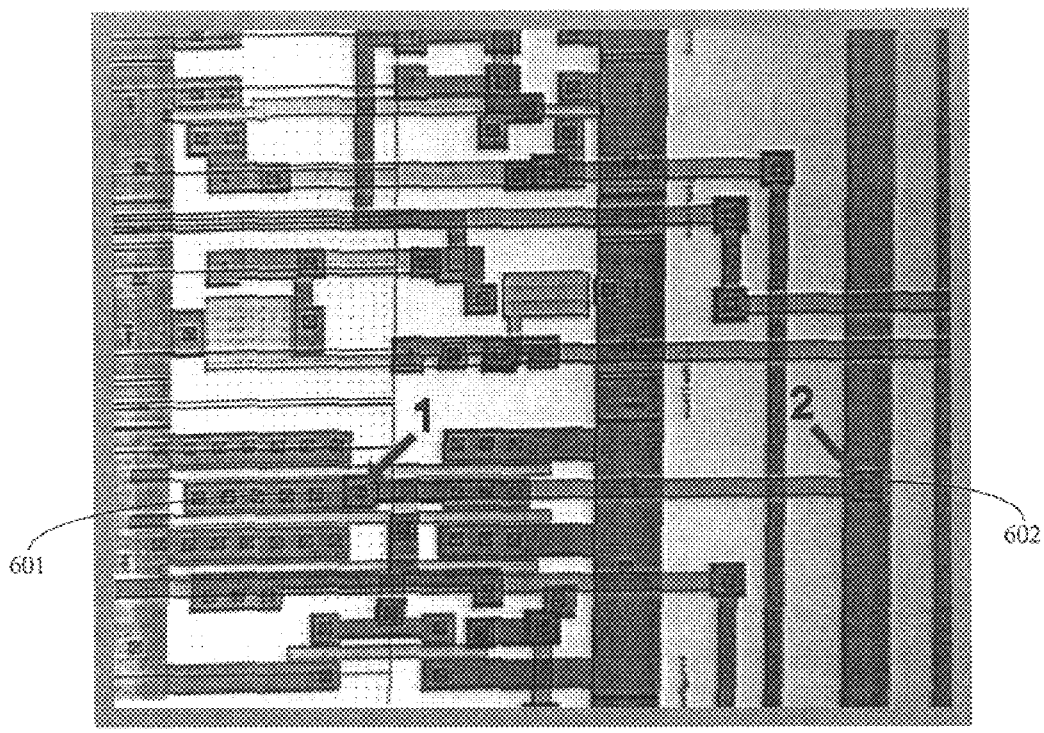
FIG. 6 is the artwork of a portion of the device around the failing net.

FIG. 6 is the artwork of a portion of the device around the failing net. The net includes two vias 601 and 602. It was believed that the vias may be the cause of the high resistance.

Figure 7:
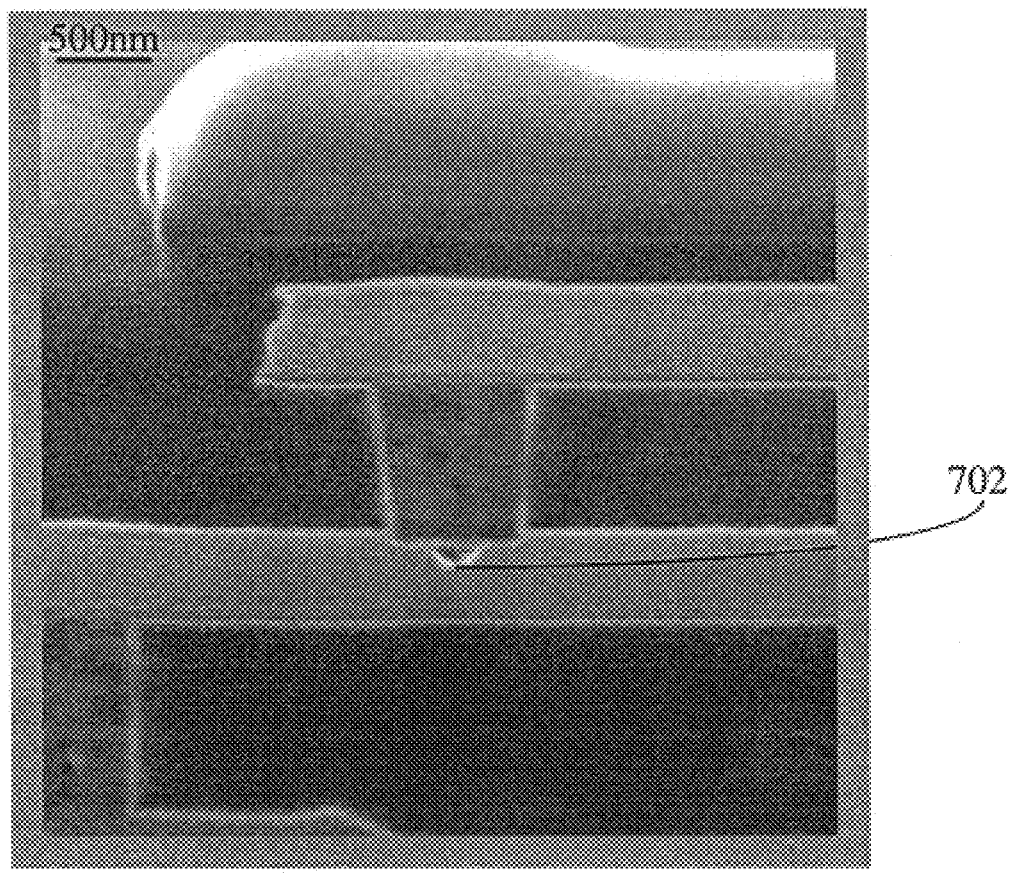
FIG. 7 is an scanning electron microscope (SEM) picture of the suspected failing via.

Bonding pads were then placed across the suspect vias 601 and 602 using a focused ion beam (FIB) technique. A very high resistance across the via was confirmed. Additional failure analysis was performed using a scanning electron microscope (SEM) and one of the suspect vias 601 and 602 was identified as a suspected failing via. FIG. 7 is an SEM picture of the suspected failing via. FIG. 7 reveals a void 702 of about 0.2 $\mu$m in the Al-alloy underneath the tungsten layer.

Figure 8:
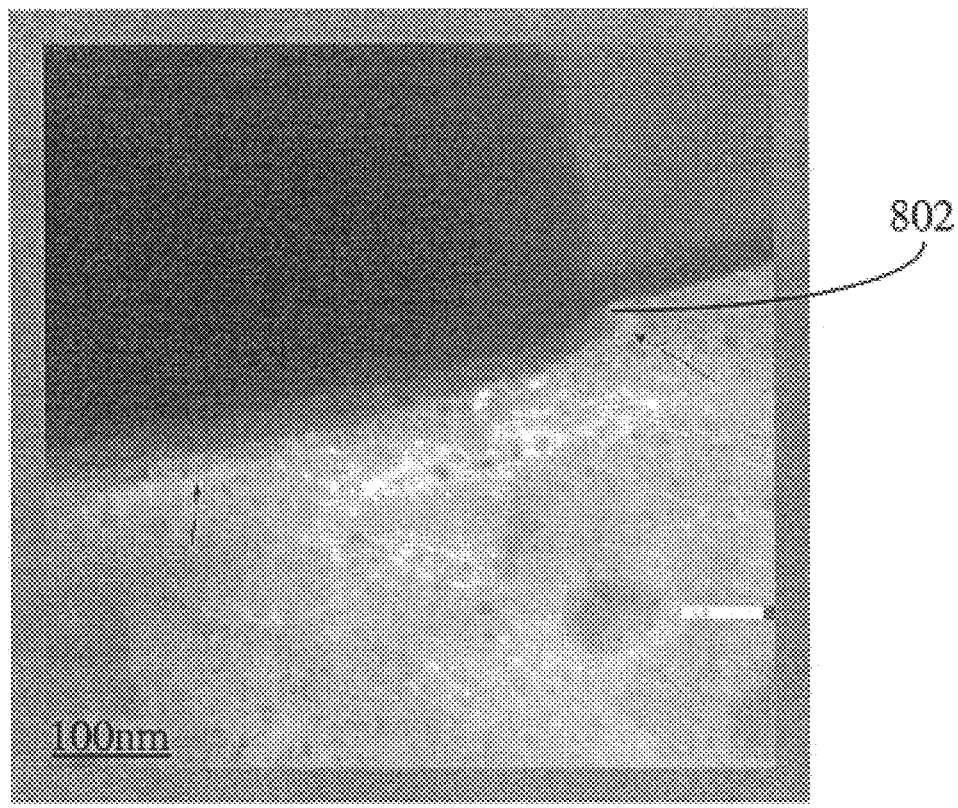
FIG. 8 is a tunneling electron microscope (TEM) picture of the suspect via near the tungsten-metal interface.

Further failure analysis was performed on the suspect via using a tunneling electron microscope (TEM). FIG. 8 is a TEM picture of the suspect via near the tungsten-metal interface. FIG. 8 reveals a very thin anomalous layer 802 of about 150 angstroms below the Ti/TiN adhesion layer underneath the tungsten plug. It is believed that the anomalous layer was aluminum oxide from de-ionized (DI) water corrosion during a via cleaning process after a via etch, during the manufacturing process.

A poor tungsten-metal interface may cause via delamination and enhance localized thermal stress. In addition, poor tungsten-metal interface may accelerate the formation of voids in the AlCu alloy underneath a tungsten plug during high temperature processes or localized electrical thermal stress. The formation of voids in the Al-alloy underneath the tungsten layer can be explained by the discontinuity in Al flux at the tungsten-AlCu interface. For example, Al flux leaving from the hot area may not be compensated from the tungsten plug during electromigration.

Voids and a thin anomalous layer at the tungsten-AlCu interface can cause severe degradation in tungsten-AlCu interconnect systems. The degradation may lead to either permanent device failures or intermittent functional failures, depending on the degree of the degradation and the amount of electrical thermal stress in the affected interconnects during certain testing or application environments. The tungsten-AlCu interconnect system is one of the major reliability problems in VLSI devices, especially with current semiconductor process technologies.

In the device under test described in the above example, new via cleaning processes were implemented by the manufacturer to reduce the DI water corrosion and to minimize thermal stress induced voiding in the tungsten-AlCu interconnect systems. The reliability of the via interconnect has been improved following the change in process. To date, no similar intermittent device failure has been observed. Thus, the technique successfully identified a source of failure in the mixed signal device, and appropriate remedial action was able to be undertaken, as a result of the isolated circuit stress and net monitoring.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come with the meaning and range of equivalency of the claims are to be embraced within their scope.

What is claimed is:

1. A method of identifying a failure net in an IC device whose output indicates an IC failure, the method comprising:

determining a potential failure net by observing a signal produced by the net that indicates failure, wherein determining a potential failure net further comprises performing a back-trace of nets in the IC device;

stressing the potential failure net while leaving other IC device nets unaffected; and observing a change in the signal produced by the potential failure net in response to the stress, thereby identifying the potential failure net as a failure net of the IC device.

2. A method as defined in claim 1, wherein stressing the potential failure net further comprises:

aligning an external source of stress to the potential failure net; and applying stress to the potential failure net.

3. A method as defined in claim 2, wherein the external source of stress is an e-beam probe.

4. A method as defined in claim 3, wherein applying stress further comprises increasing current in a primary electron beam of the e-beam probe to about 50 nAmps.

5. A method as defined in claim 3, wherein applying stress further comprises increasing the magnification of the e-beam primary electron beam, thereby increasing the electron flux.

6. A method as defined in claim 1, wherein the device is a mixed signal integrated circuit.

7. A method as defined in claim 1, wherein performing a back-trace of nets in the IC device further comprises using an e-beam probe.

8. A method as defined in claim 2, wherein the external source of stress is a laser source.

9. A method as defined in claim 8, wherein applying stress further comprises applying about 50 μwatts of optical power onto the potential failure net.

10. A method of identifying a failure net in an IC device whose output indicates an IC failure, the method comprising:

determining a potential failure net by observing a signal produced by the net that indicates failure;

stressing the potential failure net while leaving other IC device nets unaffected, wherein stressing the potential failure net further comprises aligning an external source of stress to the potential failure net and applying stress to the potential failure net;

observing a change in the signal produced by the potential failure net in response to the stress, thereby identifying the potential failure net as a failure net of the IC device; and wherein the external source of stress further comprises a mechanical probe attached to a heat source.

11. A method as defined in claim 10, wherein determining a potential failure net further comprises using an e-beam probe.

12. A method of stressing a net in an IC device, the method comprising:

aligning an external source of stress to the net, wherein the external source of stress is a laser source;

stressing the net while leaving other device nets unaffected; and monitoring the net to determine if the net fails while it is being stressed.

13. A method as defined in claim 12, wherein stressing the net further comprises applying about 50 μwatts of optical power onto the failure net.

14. A method as defined in claim 12, further comprising observing a change in a signal produced by the failure net in response to the stress, thereby identifying the net as a failure source of the device.

15. A method as defined in claim 14, wherein observing is achieved with an e-beam probe.

* * * * *